(12) United States Patent
Naya et al.

(10) Patent No.: US 8,273,982 B2
(45) Date of Patent: Sep. 25, 2012

(54) PHOTOELECTRIC CONVERTING DEVICE (75) Inventors: Masayuki Naya, Ashigara-kami-gun (JP); Jiro Tsukahara, Ashigara-kami-gun (JP); Yuichi Tomaru, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 463 days.

(21) Appl. No.: 12/503,538

(22) Filed: Jul. 15, 2009

(65) Prior Publication Data
US 2010/0012184 A1 Jan. 21, 2010

(30) Foreign Application Priority Data
Jul. 17, 2008 (JP) .................................. 2008-186294

(51) Int. Cl.
*H01L 31/00* (2006.01)
(52) U.S. Cl. ...................... 136/256; 136/265; 136/254
(58) Field of Classification Search ........... 136/243–265
See application file for complete search history.

(56) References Cited

U.S. PATENT DOCUMENTS
2005/0105085 A1* 5/2005 Naya .............................. 356/301
2008/0304060 A1* 12/2008 Naya .............................. 356/301

FOREIGN PATENT DOCUMENTS
| JP | 2001-303022 A | 10/2001 |
| JP | 2002-025635 A | 1/2002 |
| JP | 2005-259674 A | 9/2005 |

* cited by examiner

*Primary Examiner* — Basia Ridley
*Assistant Examiner* — Alexander Kollias
(74) *Attorney, Agent, or Firm* — Sughrue Mion, PLLC (57) ABSTRACT

A photoelectric converting device comprises: a first electrode layer having conductivity; a metal filled dielectric layer formed on said first electrode layer and comprising a dielectric base material in which a plurality of micropores are formed, and a plurality of conductive fine metal bodies made of a metal material which fills said plurality of micropores formed in said dielectric base material; a photoelectric converting layer that is formed on said metal filled dielectric layer and is made of a photoelectric converting material; and a second electrode layer having conductivity that is formed on said photoelectric converting layer; each of said fine metal bodies including a protruding unit that protrudes from said dielectric base material to within said photoelectric converting layer, and being electrically connected to said first electrode layer; said photoelectric converting layer covering said protruding unit of each of said fine metal bodies.

20 Claims, 4 Drawing Sheets

PHOTOELECTRIC CONVERTING DEVICE

BACKGROUND OF THE INVENTION

The present invention relates to a photoelectric converting device, and more particularly to a photoelectric converting device applicable to a solar cell or the like.

In the past, solar energy, that is, light energy, which is eco-friendly and inexhaustible, has attracted much attention as means for solving environmental issues, such as global warming and air pollution, as well as challenges in the development of energies that serve as alternatives to fossil fuels, such as oil and the like.

While solar cells have long been researched as one method that effectively utilizes light energy, the photoelectric conversion efficiency rate thereof is still considered inadequate.

As a photoelectric converting device and photoelectric converting system having a high photoelectric conversion efficiency rate of light energy, there have been disclosed in JP 2001-303022 A and JP 2002-25635 A, for example, an energy transferable device and light energy—electrical energy converting system wherein an artificial electron transport pathway of photosynthesis is established by constructing a molecule that artificially causes photosynthetic electron transport similar to photosynthesis and, using the self-organization characteristics of that molecule, constructing a structure in which a photoelectric converting system is formed on a gold electrode so as to obtain superior photoelectric conversion.

Further, in JP 2005-259674 A is disclosed a photoelectric converting device structure wherein an artificial electron transport pathway of photosynthesis is established in a metal nanostructure in which a photochemical protein complex and metal nanoparticle are deposited on a metal electrode so as to obtain superior photoelectric conversion.

Nevertheless, the photoelectric conversion rate of the light energy of the energy transferable device and light energy—electrical energy converting system described in JP 2001-303022 A and JP 2002-25635 A is problematically insufficient.

Further, the metal nanostructure described in JP 2005-259674 A simply comprises microparticles deposited on a substrate, resulting in a poor bond with the substrate, causing the metal particles to readily peel from the substrate and, in turn, difficulties in stably maintaining the photochemical protein complex.

Furthermore, with the photoelectric converting device structure of JP 2005-259674 A, it is difficult to uniformly form the metal nanostructure on the substrate surface, resulting in problems such as difficulties in uniformly fixing the photochemical complex to a wide surface area, and difficulties in producing a uniform function across the entire surface area.

SUMMARY OF THE INVENTION

It is therefore an object of the present invention to resolve the above-described problems of prior art and provide a photoelectric converting device capable of stably performing photoelectric conversion across a wide area at a high photoelectric conversion efficiency rate.

A photoelectric converting device according to the present invention comprises:

a first electrode layer having conductivity;

a metal filled dielectric layer formed on said first electrode layer and comprising a dielectric base material in which a plurality of micropores are formed, and a plurality of conductive fine metal bodies made of a metal material which fills said plurality of micropores formed in said dielectric base material;

a photoelectric converting layer that is formed on said metal filled dielectric layer and is made of a photoelectric converting material; and a second electrode layer having conductivity that is formed on said photoelectric converting layer;

each of said fine metal bodies including a filler that fills a corresponding micropore formed in said dielectric base material, and a protruding unit that is connected to one end of said filler and protrudes from said dielectric base material to within said photoelectric converting layer, and being electrically connected to said first electrode layer on the other end of said filler;

said photoelectric converting layer covering said protruding unit of each of said fine metal bodies;

at least one of said first electrode layer and said second electrode layer being a transparent conductive layer wherein light enters from the outside.

DETAILED DESCRIPTION OF THE INVENTION

The following describes in detail a photoelectric converting device according to the present invention, based on the preferred embodiments shown in accompanying drawings.

Embodiment 1

Figure 1:
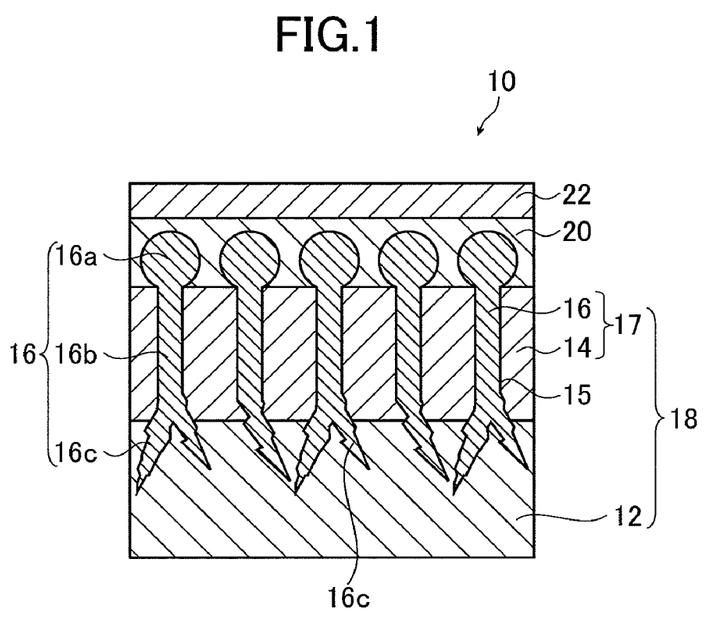
FIG. 1 is a schematic cross-sectional view illustrating the photoelectric converting device according to embodiment 1 of the present invention.

FIG. 1 is a cross-sectional view schematically illustrating a photoelectric converting device 10 according to embodiment 1 of the present invention.

The photoelectric converting device 10 comprises a metal conductive layer 12 which serves as a first electrode layer, and on this metal conductive layer 12 is formed a transparent dielectric base material 14. A plurality of micropores 15 which pass through the dielectric base material 14 is formed on this base material 14, and a plurality of fine metal bodies 16 having conductivity is filled in these micropores 15. Each of the fine metal bodies 16 comprises a filler 16b filled inside the micropore 15, a protruding unit 16a that protrudes to the surface of the dielectric base material 14, and legs 16c which penetrate the metal conductive layer 12 in protruding forms from the rear surface of the dielectric base material 14. A metal filled dielectric layer 17 is formed from the dielectric base material 14 and the plurality of fine metal bodies 16, and a metal microstructure 18 is formed from this metal filled dielectric layer 17 and the metal conductive layer 12. The photoelectric converting device 10 further comprises a photoelectric converting layer 20 having optical transmissivity that is formed on the metal microstructure 18, and a transparent conductive layer 22 that is formed on the photoelectric converting layer 20.

In the photoelectric converting device 10, when irradiated light enters through the transparent conductive layer 22 and the photoelectric converting layer 20, local plasmon is induced in the protruding units 16a of the plurality of fine metal bodies 16 of the metal microstructure 18 and, owing to the light trapping effect within the protruding units 16a from the local plasmon resonance effect and the electric field building effect near the protruding units 16a and/or the electric field building effect caused by the optical resonance effect from the optically resonant structure constructed by the metal conductive layer 12, the transparent dielectric base material 14, and the protruding units 16a of the plurality of fine metal bodies 16 of the metal microstructure 18, the absorption efficiency of the incident light of the protruding units 16a of the plurality of fine metal bodies 16 on the surface of the metal microstructure 18 increases, thereby enhancing the light energy of the incident light. As a result, in the photoelectric converting device 10, light energy is converted to electrical energy at a high efficiency rate in the photoelectric converting layer 20, and the light energy of the light irradiated from the metal conductive layer 12 or the transparent conductive layer 22 is then extracted as electrical energy (electrons or electron holes). That is, with the photoelectric converting device 10 of the present invention, a highly efficient light energy transfer efficiency rate (photoelectric conversion efficiency rate) is achieved.

The metal conductive layer 12 serves as a first electrode layer for extracting the electrical energy converted by the photoelectric converting layer 20, and is therefore connected to one set of wiring for extracting the electrical energy to the outside.

The metal conductive layer 12 used may be a conductive layer made of any metal material as long as the metal material is capable of extracting the electrical energy converted by the photoelectric converting layer 20 and, although not particularly limited, is preferably a conductive layer made of a metal material having high conductivity. The metal material preferably used for the metal conductive layer 12 is, for example, gold (Au), silver (Ag), copper (Cu), aluminum (Al), an alloy thereof, or a composite material thereof. Among such metal material, aluminum (Al) is particularly preferred.

While the metal conductive layer 12 in this embodiment 1 is integrally formed with the metal filled dielectric layer 17 made of the dielectric base material 14 and the plurality of fine metal bodies 16 so as to form the metal microstructure 18, the present invention is not limited thereto, and the metal conductive layer 12 and the metal filled dielectric layer 17 may be formed separately.

The metal filled dielectric layer 17 of the metal microstructure 18 is formed on the metal conductive layer 12 and, owing to the plasmon resonance effect from the fine irregular configuration of the surface thereof and/or the optical resonance effect from the optically resonant structure of the metal microstructure 18, the metal microstructure of the surface of the metal microstructure 18 exhibits a significant photoelectric field building effect.

The dielectric base material 14 is preferably translucent and comprises a nonconductive substrate made of a nonconductive material so as to exhibit both the plasmon resonance effect from the fine irregular configuration and the significant photoelectric field building effect from the optical resonance effect resulting from the optically resonant structure.

In embodiment 1, the material used as the dielectric base material 14 is a dielectric plate-like member (flat member) having aluminum oxide ($Al_2O_3$) as its main component, owing to its translucency. In particular, aluminum oxide ($Al_2O_3$) formed by anodizing material having aluminum (Al) as its main component is preferably used as the dielectric base material 14.

However, depending on the surface of the metal microstructure 18, in a case where a photoelectric field building effect is achieved from only the plasmon resonance effect from the fine irregular configuration, the dielectric base material 14 does not need to be translucent.

In the dielectric base material 14, the plurality of micropores 15 is formed in substantially uniform alignment. These micropores 15 may be formed by anodizing a metal base material to be anodized.

Here, the pitch between the neighboring micropores 15 and the diameter of each micropore 15 are not particularly limited as long as the values are within a controllable range that ensures that the pitch between the neighboring micropores 15, the shape of each micropore 15, and the diameter of each micropore 15 are substantially uniform as a result of anodization. For example, the pitch between the neighboring micropores 15 is 10 to 500 nm, and the diameter of the micropore 15 is 5 to 400 nm.

Furthermore, while the material used as the dielectric base material 14 in embodiment 1 is a dielectric base material having aluminum oxide as its main component, the present invention is not limited thereto and a metal oxide, that is, ceramic, preferably an optically transparent metal oxide, that is, optically transparent ceramic, wherein a metal that can be anodized is used as the metal material to be anodized and that metal material to be anodized is oxidized by anodization, may be used. The metal used as the metal base material to be anodized may be any metal as long as the metal can be subjected to anodization. Other than Al, possible examples include Ti, Ta, Hf, Zr, Si, In, Zn, and a combination of two or more thereof (including Al).

Further, in a case where the photoelectric field building effect from the optical resonance effect is sought by having the metal microstructure 18 function as the optically resonant structure, the material used as the dielectric base material 14 is preferably a translucent flat substrate. The material used as this translucent flat substrate is not particularly limited as long as the material is capable of achieving the optical resonance effect. Possible examples in addition to the aforementioned optically translucent ceramic such as aluminum oxide include, for example, glass and optically translucent resins such as acrylic resin and carbonate resin.

In this manner, in a case where the dielectric base material 14 is used as a translucent medium, the upper-side surface of the dielectric base material 14 where the protruding units 16a of the plurality of fine metal bodies 16 protrude functions as a semi-transmissive and semi-reflective first reflector, and the metal conductive layer 12 provided on the lower side of the dielectric base material 14 functions as a second reflector that reflects the light that enters the dielectric base material 14.

In a case where the metal microstructure 18 functions as an optically resonant structure, the light that enters the dielectric base material 14 from the upper-side surface of the dielectric base material 14 is repeatedly reflected between the upper-side surface of the dielectric base material 14 and the metal conductive layer 12 on the lower side of the dielectric base material 14, in accordance with the transmissivity or reflectivity of the upper-side surface of the dielectric base material 14. Here, the metal microstructure 18 comprises a resonant structure based on a sandwich structure where the dielectric base material 14 is disposed between the protruding units 16a of the plurality of fine metal bodies 16 and the metal conductive layer 12. As a result, multiple interference caused by the multiple reflected light occurs within the dielectric base material 14, resulting in resonance at a specific wavelength that satisfies resonance conditions and the exhibition of absorption characteristics that absorb light of a resonance wavelength. Then, outgoing light having physical properties that differ from the incident light based on absorption characteristics is emitted and the electric field is enhanced in response to the absorption characteristics, making it possible to achieve an electric field building effect from the optical resonance on the upper-side surface of the dielectric base material 14 where the protruding units 16a of the plurality of fine metal bodies 16 protrude, that is, at the protruding units 16a of the plurality of fine metal bodies 16 of the photoelectric converting layer 20.

In a case where the metal microstructure 18 functions as an optically resonant structure, the resonance wavelength may be changed in accordance with the thickness of the dielectric base material 14 that serves as the translucent medium and the average refraction index within the dielectric base material 14. Here, a thickness d of the dielectric base material 14 and an average refraction index n within the dielectric base material 14 substantially satisfy the equation below, making it possible to change the resonance wavelength λ by simply changing the thickness d of the dielectric base material 14.

$$\lambda \approx 2nd/(m+1)$$

(Where, m is an integer.)

The average refraction index n within the dielectric base material 14 refers to a refraction index equivalent to the average of the refraction index of the dielectric base material 14 itself and the refractive index of the plurality of fine metal bodies 16 filled within the plurality of micropores 15 of the dielectric base material 14.

Furthermore, in the present invention, the metal microstructure 18 used preferably has both a fine irregular configuration capable of achieving a plasmon resonance effect and an optically resonant structure capable of achieving an optical resonance effect. With this arrangement, on the protruding units 16a of the plurality of fine metal bodies 16 protruding to the surface of the dielectric base material 14, that is, on the photoelectric converting layer 20, local plasmon resonance is produced so as to achieve a high electric field building effect, that is, a plasmon resonance effect, making it possible to achieve on the photoelectric converting layer 20 that covers the protruding units 16a of the plurality of fine metal bodies 16 on the upper side of the dielectric base material 14 an electric field building effect, that is, optical resonance effect, from the optical resonance based on the multiple interface of the multiple layers of reflected light within the dielectric base material 14.

The protruding unit 16a of the fine metal body 16 protrudes from one end of the filler 16b to the surface of the dielectric base material 14, and comprises a size, that is, a diameter, capable of inducing local plasmon. When the incident light is irradiated on the protruding unit 16a on the surface of the dielectric base material 14, an electric field collects on the protruding unit 16a as a result of the local plasmon resonance phenomenon, thereby producing an enhanced electric field around the periphery of the protruding unit 16a (an antenna effect).

The protruding unit 16a has a diameter that is larger than the diameter of the opening of the micropore 15, and preferably has a shape suitable for inducing local plasmon, and the fine metal body 16 preferably takes on a mushroom shape, for example. In particular, the size, layout, and density of the protruding unit 16a of the fine metal body 16 are preferably suitable for achieving a synergetic effect that combines the local plasmon effect and the optical resonance effect. Nevertheless, the present invention is not limited thereto, and the protruding unit 16a may have a diameter less than or equal to the diameter of the opening of the micropore 15.

The filler 16b has one end connected to the protruding unit 16a, is made of a metal member of a pillar shape having the same diameter as the micropore 15, and has the other end connected to the legs 16c that extend into the interior of the metal conductive layer 12.

The legs 16c are for electrically connecting the protruding unit 16a and the filler 16b with the metal conductive layer 12, and are preferably inserted in a projecting shape into the interior of the metal conductive layer 12, as in the example shown in the figure, but may simply be in contact with the metal conductive layer 12.

Furthermore, in this embodiment, the structure is designed so that the fine metal body 16 puts the metal conductive layer 12 that serves as the first electrode layer and the transparent conductive layer 22 that serves as the second electrode layer in a conductive state, thereby having the effect of making it easy to remove the load (electrons, electron holes) achieved by the photoelectric converting layer 20.

The fine metal body 16 may be made of any material as long as the material is a metal material that produces a local plasmon resonance phenomenon. Examples of metals that readily produce a local plasmon resonance phenomenon include gold (Au), silver (Ag), copper (Cu), platinum (Pt), nickel (Ni), titanium (Ti), aluminum (Al), an alloy thereof, or a composite material thereof, with gold (Au) and silver (Ag) having a high electric field building effect particularly preferred.

Here, the structure applied as the metal microstructure 18 may be a microstructure having a mushroom-shaped metal pattern fabricated by plating the anodized porous aluminum oxide disclosed in JP 2005-172569 A according to an application of the inventors of the present invention. Furthermore, to use a microstructure of such a structure as the metal microstructure 18 used in the present invention, the optical resonance wavelength exhibiting a mushroom-shaped metal pattern and the plasmon resonance wavelength are preferably adjusted to optimum wavelengths.

The photoelectric converting layer 20 is for converting light energy enhanced by the plasmon effect and/or optical resonance effect from the protruding units 16a of a large number of the fine mental bodies 16 protruding to the upper-side surface of the dielectric base material 14 of the metal microstructure 18 to electrical energy. The photoelectric converting layer 20 is an optically transmissive layer, preferably a transparent layer, formed on the metal microstructure 18, that is on the protruding unit 16a of the fine metal body 16 protruding to the upper-side surface of the dielectric base material 14, and is formed on the surface of the dielectric base material 14 so as to cover the protruding units 16a of a large number of the fine metal bodies 16 that protrude from the surface of the dielectric base material 14.

In this photoelectric converting layer 20, the absorption efficiency of the light that enters the surface of the metal microstructure 18 is increased by the light trapping effect of the fine irregular configuration from the local plasmon effect from the local plasmon resonance induced by the fine irregular configuration (by the protruding units 16a of the plurality of fine metal bodies 16) of the surface of the metal microstructure 18 by the irradiated light that enters from the transparent conductive layer 22, and an electric field building effect near the fine irregular configuration (protruding units 16a of the plurality of fine metal bodies 16) of the surface of the metal microstructure 18 and/or the electric field building effect of the protruding units 16a of the plurality of fine metal bodies 16 formed on the surface of the metal microstructure 18 based on the optical resonance effect from the optically resonant structure formed by the metal microstructure 18, thereby enhancing the light energy of the incident light and, as a result, achieving conversion of the enhanced light energy to electrical energy at a high efficiency rate.

The material used as the photoelectric converting material that constitutes the photoelectric converting layer 20 may be any material as long as the material is capable of efficiently converting enhanced light energy to electrical energy. In particular, while the material is not particularly limited as long as the plasmon resonance wavelength exhibited by the structure of the plurality of protruding units 16a and/or the optical resonance wavelength exhibited by the structure of the optical resonator formed by the metal microstructure 18 are produced in the protruding units 16a of the plurality of fine metal bodies 16 of the metal microstructure 18 at optimum wavelengths, and the material is capable of converting the light enhanced by the plasmon resonance effect and/or optical resonance effect to electrical energy, the preferred material is ceramic or a semiconductor material, for example.

Examples of such a preferred photoelectric converting material include, for example, titanium oxide ($TiO_2$), strontium titanate ($TiSrO_3$), barium titanate ($TiBaO_3$), tin oxide ($SnO_2$), tungstic anhydride ($WO_3$), zinc oxide (ZnO), zinc oxide-magnesium oxide composite metal oxide (ZnO—MgO), tin oxide-magnesium oxide composite metal oxide ($SnO_2$—MgO), a combination of two or more thereof, or a complex thereof.

The transparent conductive layer 22 is formed on the photoelectric converting layer 20 and, because it serves as a second electrode layer for extracting the electrical energy converted by the photoelectric converting layer 20, is connected to other wiring for extracting the electrical energy to the outside. Further, the transparent conductive layer 22 is preferably a transparent conductive layer having high optical transmissivity since the light irradiated on the metal microstructure 18 for photoelectric conversion needs to enter the photoelectric converting layer 20 and the metal microstructure 18.

Here, the irradiated light that enters from the transparent conductive layer 22 preferably includes light of a wavelength capable of exciting local plasmon in the fine irregular configuration formed by the protruding units 16a of the plurality of fine metal bodies 16 of the metal microstructure 18 and/or preferably includes light of a wavelength that produces optical resonance from the multiple interface of the resonant structure formed by the metal microstructure 18.

The material used as the transparent conductive layer 22 is not particularly limited and may be a conductive layer made of any type of conductive material as long as the material has high optical transmissivity and is capable of extracting the electrical energy converted by the photoelectric converting layer 20. The preferred transparent conductive material used for the transparent conductive layer 22 is, for example, tin oxide ($SnO_2$) and/or ITO (In—Sn oxide; indium tin oxide), a combination of two or more thereof, or a complex thereof.

While the photoelectric converting layer 20 and the transparent conductive layer 22 are formed as different layers in the photoelectric converting device 10, the present invention is not limited thereto, and in a case where the photoelectric converting material of the photoelectric converting layer 20 and the transparent conductive material of the transparent conductive layer 22 are identical, that is, tin oxide ($SnO_2$), for example, the photoelectric converting layer 20 and the transparent conductive layer 22 may be formed as a single layer.

Further, while the transparent conductive layer 22 is established as the second electrode layer bordering the photoelectric converting layer 20, and the non-transparent metal conductive layer 12 is established as the first electrode layer bordering the dielectric base material 14 so that the irradiated light enters from the transparent conductive layer 22 in the photoelectric converting device 10 of the example shown in the figure, the present invention is not limited thereto. For example, the transparent conductive layer may be used as the first electrode layer rather than the metal conductive layer 12. In such a case, the irradiated light may enter from only the side of the transparent conductive layer 22 bordering the photoelectric converting layer 20, or the irradiated light may enter from both sides of the transparent conductive layer 22 of the second electrode layer and the transparent conductive layer of the first electrode layer.

Embodiment 2

Figure 2:
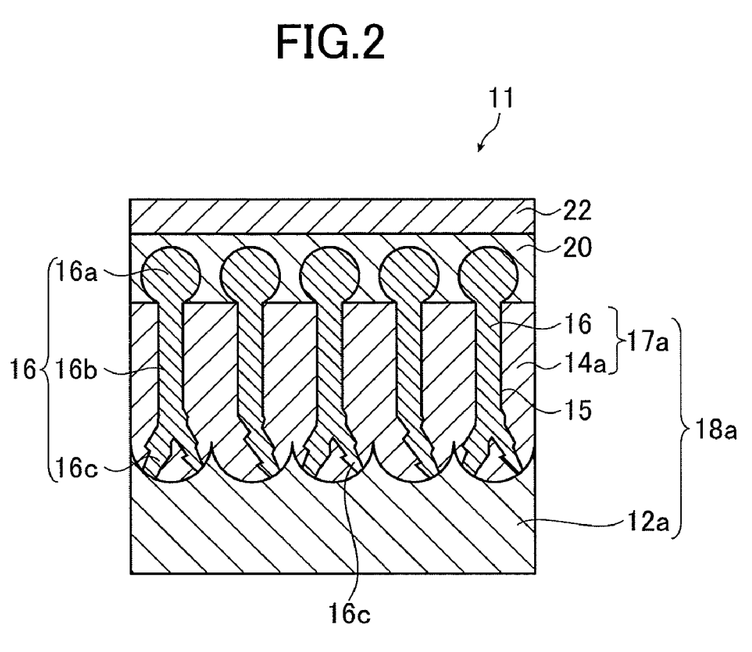
FIG. 2 is a schematic cross-sectional view illustrating the photoelectric converting device according to embodiment 2.

FIG. 2 illustrates the structure of a photoelectric converting device 11 according to embodiment 2. While the bonding surface between the metal conductive layer 12 and the dielectric base material 14 is flat in the photoelectric converting device 10 of embodiment 1 shown in FIG. 1, the bonding section between a metal conductive layer 12a and a dielectric base material 14a may have an irregular configuration, as in the photoelectric converting device 11 shown in FIG. 2.

The dielectric base material 14a and the plurality of fine metal bodies 16 in the photoelectric converting device 11 comprise a metal filled dielectric layer 17a of a metal microstructure 18a.

Furthermore, as described in embodiment 1, in a case where anodization is executed on metal material to be anodized that is made of aluminum, etc., so as to form aluminum oxide and a plurality of micropores on the upper area of the metal material to be anodized, the boundary section between the aluminum that serves as the metal conductive layer and the aluminum oxide that serves as the dielectric base material inevitably is near the bottom of the plurality of micropores. Since the bottom of each micropore is round in shape, as shown in FIG. 2, the boundary section between the metal conductive layer 12a and the dielectric base material 14a has the irregular configuration.

Next, the manufacturing method of the photoelectric converting device 11 of embodiment 2 illustrated in FIG. 2 will be described with reference to FIGS. 3A to 3F.

Figure 3A:
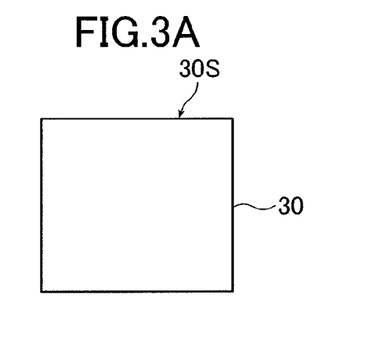
FIGS. 3A to 3F are process charts schematically illustrating the fabrication process of the photoelectric converting device illustrated in FIG. 2.

First, as shown in FIG. 3A, a metal base material 30 to be anodized that comprises aluminum (Al), for example, as its main component, is prepared. Here, the term "main component" refers to a component that amounts to 90% or more of the components constituting the metal base material 30 to be anodized.

Figure 3B:
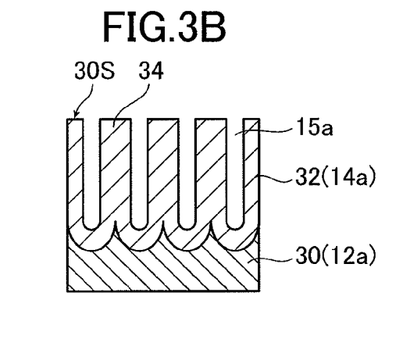

Next, a surface 30S of the metal base material 30 to be anodized is anodized and, as shown in FIG. 3B, aluminum oxide ($Al_2O_3$) having a plurality of micropores 15a is formed.

Anodization may be implemented by, for example, using the surface 30S of the metal base material 30 to be anodized as an anode and an electrode (not shown) made of materials such as carbon and aluminum and disposed opposed the surface 30S as a cathode, immersing these in an electrolyte solution for anodization, and applying voltage between the anode and cathode. The electrolyte solution used is preferably an acidic electrolyte solution that includes one or two or more types of acid, such as sulfuric acid, phosphoric acid, chromic acid, oxalic acid, sulfamic acid, benzene-sulfonic acid, and amide-sulfonic acid, for example.

When the metal base material 30 to be anodized that has aluminum (Al) as its main component is anodized, the oxidation reaction progresses in the substantially orthogonal direction from the surface 30S thereof, thereby generating the dielectric base material 14a made of aluminum oxide ($Al_2O_3$). Then, the metal conductive layer 12a is formed from the unreacted aluminum positioned under the dielectric base material 14a.

The dielectric base material 14a generated from anodization in this manner comprises a structure wherein a fine columnar body 34 of a substantially regular hexagonal shape in a plan view is arranged in a contiguous manner. At the substantial center of each fine columnar body 34, in the depth direction from the surface of the dielectric base material 14a, is formed the micropore 15a having an inner diameter that is substantially equal to that of the other micropores 15a. At this time, the bottom of each micropore 15a has a rounded shape, thereby forming a irregular configuration in the boundary section between the metal conductive layer 12a and the dielectric base material 14a. The structure of the aluminum oxide layer generated by anodization is described by Hideki Masuda in "Fabrication of Mesoporous Aluminum Oxide by Anodization and Application as a Functional Material," Material Technologies, Vol. 15, No. 10, 1997, p. 34.

In this embodiment, the conditions for anodization may be any conditions that permit formation of aluminum oxide ($Al_2O_3$; mesoporous aluminum oxide) having the plurality of micropores 15a uniformly arranged. In a case where oxalic acid is used as the electrolyte solution, preferred conditions include, for example, an electrolyte solution concentration of 0.5M, a solution temperature of 15° C., and an applied voltage of 40V.

Further, in anodization, the pitch between the neighboring micropores 15a is controllable within the range of 10 to 500 nm, and the diameter of a micropore 26a is controllable within the range of 5 to 400 nm.

In JP 2001-9800 A and JP 2001-138300 A are disclosed methods of controlling the formed position and diameter of a micropore. Use of these methods makes it possible to substantially regularly form a micropore having an arbitrary diameter within the aforementioned range.

As described later, the micropore 15a serves as a molding tool of the filler 16b of the fine metal body 16. Thus, since the micropore 15a can be substantially regularly formed on a substrate, it is possible to uniformly fabricate the metal microstructure on a substrate having a wide surface area.

Figure 3C:
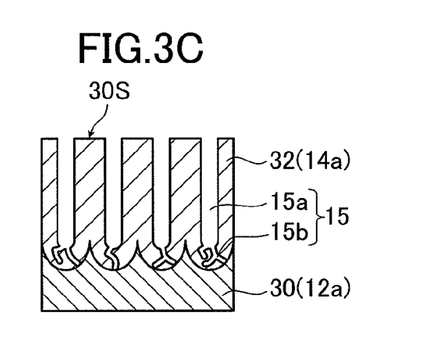

Next, as a result of current recovery processing, as shown in FIG. 3C, a branched concave unit 15b having a plurality of branches and a branch shape that is more slender than the micropore 15a is formed from the tip of the micropore 15a.

Here, the term "current recovery processing" refers to continually decreasing the applied voltage of the aforementioned anodization process and then executing anodization on the metal base material 30 to be anodized.

Specifically, after a predetermined voltage is applied by the aforementioned anodization process, a voltage lower than the predetermined voltage is applied, thereby reducing the current value. When this low voltage is continually applied, a slender concave area having an inner diameter that is smaller than that of the micropore 15a is formed from the tip of the micropore 15a, and the current value gradually increases.

When the current value increase slows down or when the current value becomes constant, a voltage lower than the voltage applied is applied so as to further form a slender concave area. When the voltage is continually applied and the increase in current value slows down or the current value becomes constant, the applied voltage is once again decreased.

In this manner, current recovery processing that continually decreases the applied voltage is performed during anodization, making it possible to form a branched concave unit 15b of a branched shape that gradually tapers toward the tip. The tip of the branched concave unit 15b thus formed passes through the dielectric base material 14a to the metal conductive layer 12a.

The micropore 15a thus formed serves as a molding tool for forming the filler 16b of the fine metal body 16, and the branched concave unit 15b serves as a molding tool for forming the legs 16c of the fine metal body 16. The branched concave unit 15b is a concave unit having a diameter that is more slender than that of the micropore 15a, and comprises one or more concave units of a branched shape that branches from the tip (bottom area) of the micropore 15a. The concave unit of the branched shape of the branched concave unit 15b also includes a concave unit of a shape that further branches into a plurality of branches at the tip thereof. These branched concave units 15b are basically formed in different directions and, needless to say, tips of the concave units having a branched shape at times basically face different directions.

The inner diameter of the branched concave unit 15b is substantially the same as the outer diameter of the legs 16c, and is preferably within a range of 200 nm or less.

The current recovery processing is processing that repeats the step of applying a lower voltage until either the current value increase slows down or the current value becomes constant during anodization.

The repeated frequency of the aforementioned step and the voltage applied in each step may be suitably set in accordance with the material of the metal base material to be anodized, the type of electrolyte solution, the conditions of anodization such as the density and temperature of the electrolyte solution, the shape of the formed micropore 15, and the like.

For example, aluminum may be used as the metal base material to be anodized and oxalic acid may be used as the electrolyte solution. The conditions of the current recovery processing in such a case are described in "Anodized Aluminum Theory: Questions and Answers on the Theoretical Grounding of Anodized Aluminum Technologies," by Toshihiko Sato.

Figure 3D:
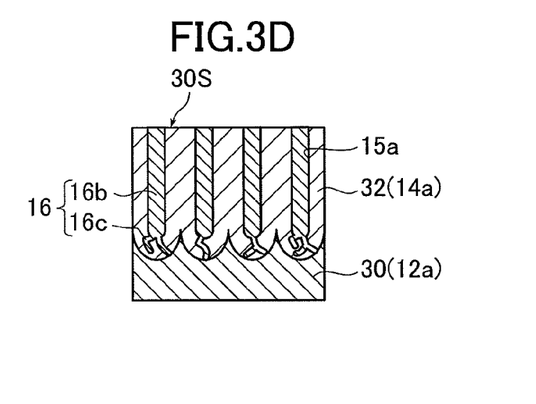

Next, electrolytic plating is performed, thereby filling metal into each inner area of the plurality of micropores 15a and the branched concave units 15b, as shown in FIG. 3D. At this time, the branched concave unit 15b passes through the dielectric base material 14a to the metal conductive layer 12a, thereby connecting the legs 16c of the fine metal body 16 to the metal conductive layer 12a. In this embodiment, gold (Au) is preferably used as the metal material filled inside the micropore 15a and the branched concave unit 15b, for example.

In this embodiment, the electrolytic plating is performed using the metal conductive layer 12a as an electrode, making it possible to yield with priority metal material from the branched concave unit 15b having a strong electric field. The electrolytic plating is continually executed, thereby filling the metal material into each micropore 15a and branched concave unit 15b and forming the filler 16b and the legs 16c of the fine metal body 16.

The plating process is continued even after the metal material is filled, until a position equivalent to the surface of the dielectric base material 14a is achieved. In other words, the plating process is continued until the branched concave unit 15b and the micropore 15a are completely filled with metal material, and metal material (gold) is excessively plated around the periphery of the micropore 15a, protruding from the micropore 15a and increased to a size larger than the hole diameter of the micropore 15a.

Figure 3E:
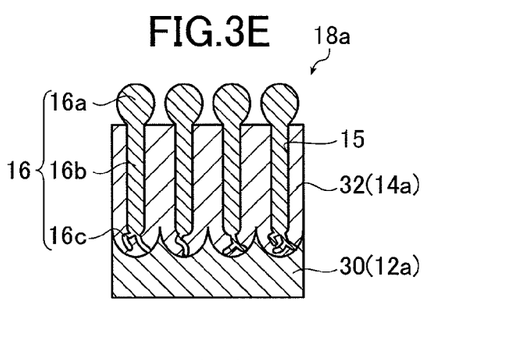

That is, even after the micropore 15a is filled with metal material (gold), the effect of the electric field around the periphery of the micropore 15a causes the metal material (gold) to be deposited around the periphery of the micropore 15a. With this arrangement, as shown in FIG. 3E, the protruding unit 16a of a size greater than the diameter of the micropore 15a is formed. Furthermore, while the diameter of the protruding unit 16a is not particularly limited as long as it is of a size that permits induction of local plasmon, a diameter of the protruding unit 16a that is greater than the hole diameter of the micropore 15a, that is, a so-called mushroom-shaped fine metal body 16, is preferred, as described above.

Figure 4A:
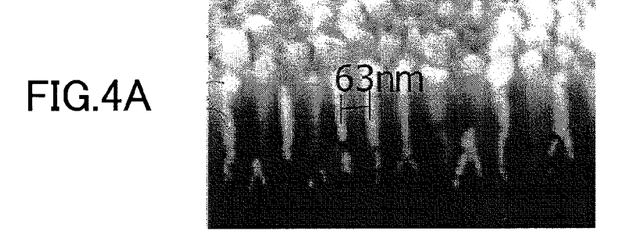
FIGS. 4A and 4B are microscope (SEM) photographs respectively showing the cross-section and upper surface of the metal microstructure used in the photoelectric converting device illustrated in FIG. 2.
Figure 4B:
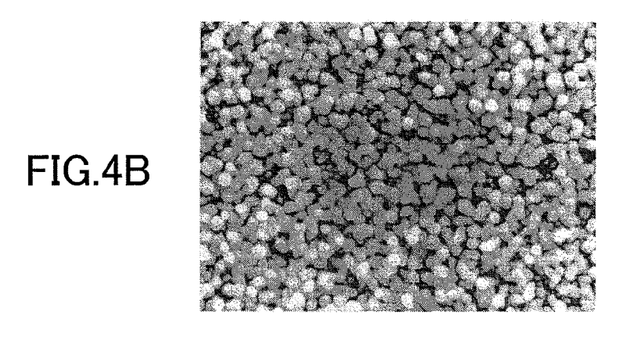

FIGS. 4A and 4B show the metal microstructure 18a thus manufactured. Here, FIG. 4A is a microscope (SEM) photograph showing the cross-sectional side view of the metal conductive layer (aluminum) 12a, the fine metal body (gold) 16, and the dielectric base material (aluminum oxide) 14a of the metal microstructure 18a, and FIG. 4B is a microscope (SEM) photograph showing the upper surface of the metal microstructure 18a, that is, the upper surface of the protruding units 16a of a large number of the fine metal bodies (gold) 16.

The fine metal body 16 comprises a structure wherein the filler 16b is embedded inside the micropore 15 of the dielectric base material 14a, resulting in a strong bond between the fine metal body 16 and the dielectric base material 14a and achieving the effect making the fine metal body 16 difficult to peel from the dielectric base material 14a.

In the protruding unit 16a, local plasmon is induced and, from the light trapping effect within the protruding unit 16a and the electric field building effect near the protruding unit 16a that result from the local plasmon effect, the light absorption efficiency increases, thereby achieving a highly efficient photoelectric conversion effect.

Figure 3F:
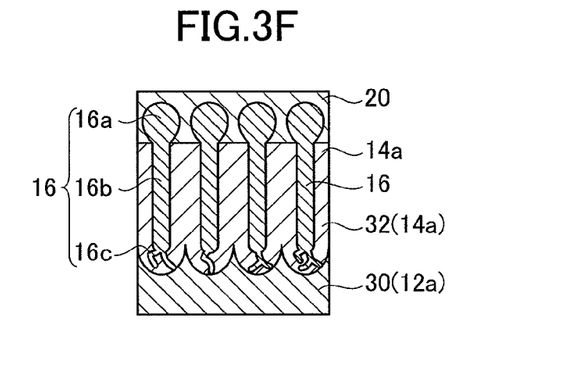

Next, as shown in FIG. 3F, the photoelectric converting layer 20 is formed so as to cover the protruding unit 16a of the fine metal body 16 on the dielectric base material 14a of the metal microstructure 18a.

Here, the photoelectric converting layer 20 is best formed by evaporation or sputtering using the aforementioned photoelectric converting material.

In this embodiment, titanium oxide ($TiO_2$) is used.

Furthermore, the transparent conductive layer 22 is formed on the photoelectric converting layer 20.

Here, the transparent conductive layer 22 is best formed by evaporation or sputtering using the aforementioned transparent conductive material.

Thus, as described above, the photoelectric converting device 11 illustrated in FIG. 2 is manufactured.

Embodiment 3

Figure 5:
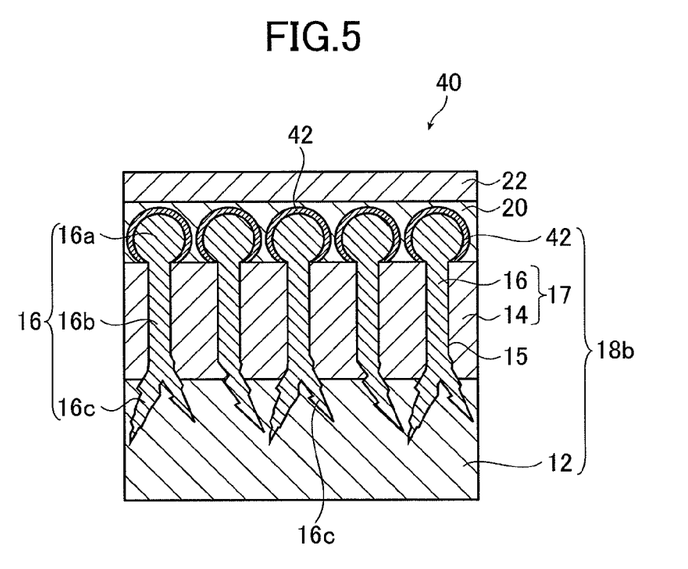
FIG. 5 is a schematic cross-sectional view illustrating the photoelectric converting device according to a modification of embodiment 3.

FIG. 5 illustrates the structure of a photoelectric converting device 40 according to embodiment 3. In this photoelectric converting device 40, the surface of the protruding unit 16a of the fine metal body 16 of the photoelectric converting device 10 according to embodiment 1 shown in FIG. 1 is covered with a metal film 41. The metal film 42 is made using a metal material that is different from the metal material constituting the fine metal body 16.

Furthermore, in the photoelectric converting device 40, the metal film 42 is best formed by subjecting the protruding unit 16a of the fine metal body 16 to a plating process or evaporation process using a metal material other than the metal material used for the fine metal body 16, such as a metal material not used for the fine metal body 16 that is, for example, the aforementioned gold, silver, copper, aluminum, alloy thereof, or composite material thereof, after formation of the protruding unit 16a of the fine metal body 16. Here, in the photoelectric converting device 40, the metal conductive layer 12, the dielectric base material 14, the fine metal body 16, and the metal film 42 constitute a metal microstructure 18b.

Furthermore, in the photoelectric converting device 40 of this embodiment, the protruding unit 16a of the fine metal body 16 is preferably formed from gold (Au), and the metal film 41 is preferably formed from silver (Ag). The gold constituting the protruding unit 16a of the fine metal body 16 is thinly coated with silver (Ag) so as to form the metal film 42, making it possible to achieve an effect of increasing the plasmon resonance effect as well as an effect of suppressing silver (Ag) oxidation.

Embodiment 4

Figure 6:
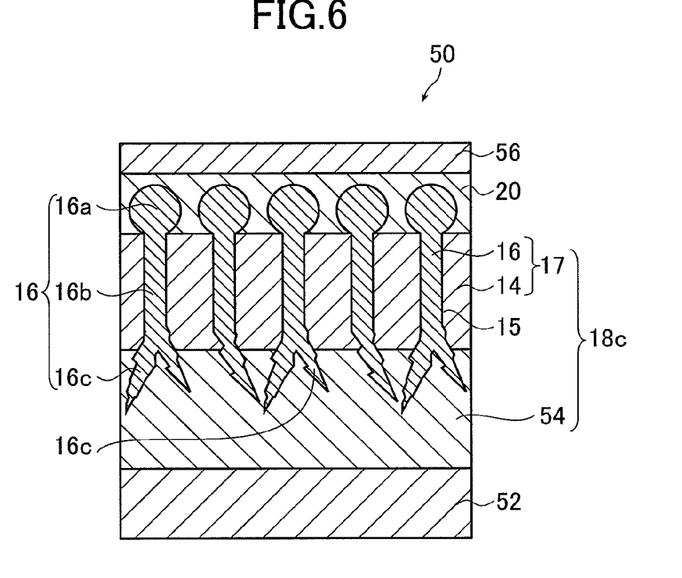
FIG. 6 is a schematic cross-sectional view illustrating the photoelectric converting device according to a modification of embodiment 4.

FIG. 6 illustrates the structure of a photoelectric converting device 50 according to embodiment 4. This photoelectric converting device 50 comprises a transparent conductive layer 54 and a metal conductive layer 56 in place of the metal conductive layer 12 and the transparent conductive layer 22 of the photoelectric converting device 10 of embodiment 1 illustrated in FIG. 1, and further comprises a transparent substrate 52 configured to support the transparent conductive layer 54.

The transparent substrate 52 is provided on the bottom side of the transparent conductive layer 54 and supports the transparent conductive layer 54. Thus, by supporting the transparent conductive layer 54, the transparent substrate 52 also supports the metal filled dielectric layer 17 comprising the dielectric base material 14 and the plurality of fine metal bodies 16 formed thereon, the photoelectric converting layer 20, and the metal conductive layer 56. The transparent conductive layer 54 and the metal filled dielectric layer 17 constitute a metal microstructure 18c.

Here, the material used as the transparent substrate 52 is not particularly limited as long as it is transparent, and may be suitably selected in accordance with the fabrication process and application of the photoelectric converting device 50. For example, in a case where an etching process is included in the fabrication process of the photoelectric converting device 50, a material having etching resistance is preferably used.

One example of the material used as the transparent substrate 52 is a glass substrate.

The transparent conductive layer 54 and the metal conductive layer 56 are respectively formed from the same materials as the transparent conductive layer 22 and the metal conductive layer 12 of the photoelectric converting device 10 of FIG. 1.

Furthermore, in the photoelectric converting device 50 illustrated in FIG. 6, the irradiated light enters from the side of the transparent substrate 52, proceeds to the protruding units 16a of the plurality of fine metal bodies 16 that protrude from the dielectric base material 14 via the transparent substrate 52, the transparent conductive layer 54 of the metal microstructure 18c, and the dielectric base material 14 so as to induce the local plasmon and, in turn, increase the absorption efficiency rate of the incident light of the fine irregular configuration of the surface of the metal microstructure 18 as a result of the electric field building effect caused by a local plasmon effect, thereby enhancing the light energy of the irradiated light. This light energy of the irradiated light is then converted to electrical energy at high efficiency in the photoelectric converting layer 20 and extracted from the metal conductive layer 56 or the transparent conductive layer 54 as electrical energy.

Figure 7A:
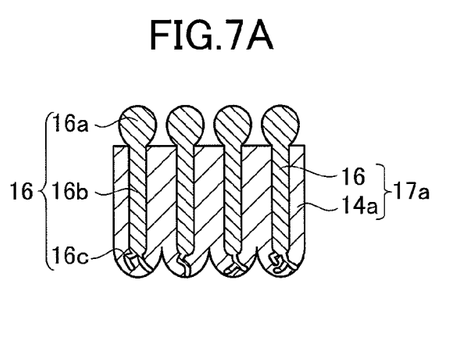
FIGS. 7A to 7C are process charts schematically illustrating the fabrication process of the photoelectric converting device illustrated in FIG. 6.

The method of producing the photoelectric converting device 50 of embodiment 4 will now be described. First, similar to the photoelectric converting device 11 of embodiment 2, the metal microstructure 18a is formed in accordance with the process illustrated in FIGS. 3A to 3E, and subsequently, as illustrated in FIG. 7A, the metal conductive layer 12a is removed so as to form the metal filled dielectric layer 17a comprising the fine metal body 16 and the dielectric base material 14a. This process may be performed using any method capable of removing the aluminum constituting the metal conductive layer 12a. Wet etching or dry etching may be used, for example. In this embodiment, the aluminum (metal to be anodized) is removed using wet etching, for example.

Figure 7B:
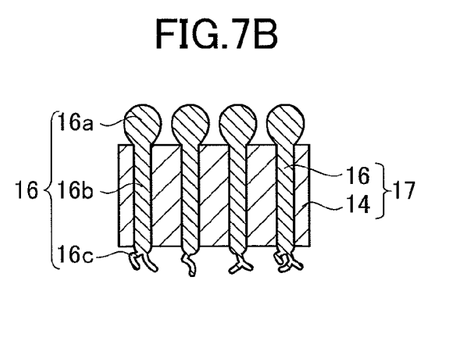

Next, as illustrated in FIG. 7B, a part of the dielectric base material 14a of the metal filled dielectric layer 17a is removed from the tip side of the legs 16c of the fine metal body 16 so as to expose the legs 16c of a branched protruding form of the fine metal body 16. With this arrangement, it is possible to form the metal filled dielectric layer 17 comprising the fine metal body 16 and the dielectric base material 14. The method used for this process is not particularly limited as long as the method is capable of selectively removing only a part of the dielectric base material 14 made of aluminum oxide without removing the legs 16c of the fine metal body 16. For example, wet etching or dry etching may be used.

Figure 7C:
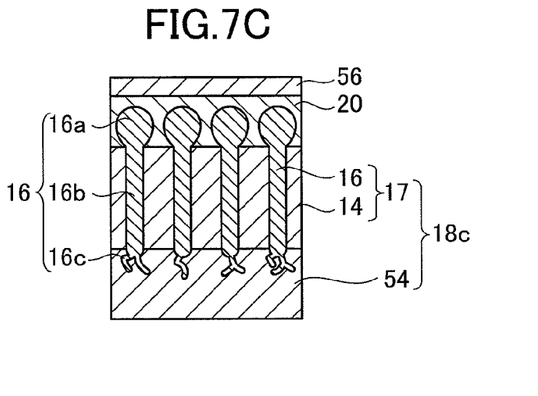

Next, as shown in FIG. 7C, the transparent conductive layer 54 is formed on the surface of the dielectric base material 14 positioned on the side of the legs 16c of the fine metal body 16 and the legs 16c so as to cover the legs 16c, thereby forming the metal microstructure 18c. Subsequently, the photoelectric converting layer 20 is formed on the surface of the dielectric base material 14 positioned on the side of the protruding unit 16a of the fine metal body 16 and the protruding unit 16a so as to cover the protruding unit 16a, thereby further forming the metal conductive layer 56 on the photoelectric converting layer 20.

Here, the transparent conductive layer 54 and the metal conductive layer 56 are respectively formed by evaporation or sputtering, similar to the transparent conductive layer 22 and the metal conductive layer 12 of the photoelectric converting device 10 of FIG. 1.

Subsequently, as illustrated in FIG. 6, the transparent substrate 52 is installed under the transparent conductive layer 54 of the metal microstructure 18c so as to form the photoelectric converting device 50.

Note that the formation order of the transparent conductive layer 54 and the transparent substrate 52, and the photoelectric converting layer 20 and the metal conductive layer 56 is not particularly limited. Formation may be performed in any order.

While the above has described in detail the photoelectric converting device of the present invention, note that the present invention is not limited to the above embodiments and various modifications may be made without departing from the spirit and scope of the invention.

The photoelectric converting device of the present invention exhibits a high efficiency rate of photoelectric conversion of irradiated incident light, and is therefore preferably utilized with solar cells.

What is claimed is:

1. A photoelectric converting device comprising:
    a first electrode layer having conductivity;
    a metal filled dielectric layer formed on said first electrode layer and comprising a dielectric base material in which a plurality of micropores are formed, and a plurality of conductive metal bodies made of a metal material which fills said plurality of micropores formed in said dielectric base material;
    a photoelectric converting layer that is formed on said metal filled dielectric layer and is made of a photoelectric converting material; and
    a second electrode layer having conductivity that is formed on said photoelectric converting layer;
    each of said metal bodies including a filler that fills a corresponding micropore formed in said dielectric base material, and a protruding unit that is formed on one end of each of said metal bodies and protrudes from said dielectric base material to within said photoelectric converting layer, each of said metal bodies being electrically connected to said first electrode layer on the other end of each of said metal bodies;
    said photoelectric converting layer covering said protruding unit of each of said metal bodies;
    at least one of said first electrode layer or said second electrode layer being a transparent conductive layer wherein light enters from the outside.

2. The photoelectric converting device according to claim 1, wherein each of said metal bodies comprises legs formed on the other end of each of said metal bodies connected to said first electrode layer that penetrate said first electrode layer.

3. The photoelectric converting device according to claim 1, wherein said protruding unit of each of said metal bodies comprises a diameter of a size that is capable of inducing a plasmon.

4. The photoelectric converting device according to claim 1, wherein:
    said dielectric base material has optical transmissivity;
    said protruding unit of each of said metal bodies has optical reflectivity;
    said first electrode layer has optical reflectivity; and
    said metal filled dielectric layer and said first electrode layer constitute an optical resonator of a structure in which said dielectric base material is disposed between said protruding units of said plurality of metal bodies and said first electrode layer.

5. The photoelectric converting device according to claim 4, wherein said protruding unit of each of said metal bodies comprises a diameter of a size that is capable of inducing a plasmon.

6. The photoelectric converting device according to claim 1, wherein said protruding unit of each of said metal bodies comprises a diameter of a size that is greater than the diameter of said filler.

7. The photoelectric converting device according to claim 1, wherein said dielectric base material is made of aluminum oxide obtained by anodizing a portion of a metal base material having aluminum as its main component, and said remaining metal base material that was not anodized serves as said first electrode layer.

8. The photoelectric converting device according to claim 7, wherein said plurality of micropores is formed by said anodization process.

9. The photoelectric converting device according to claim 1, wherein said second electrode layer is said transparent conductive layer.

10. The photoelectric converting device according to claim 9, wherein said first electrode layer is made of a metal conductive layer.

11. The photoelectric converting device according to claim 9, wherein said photoelectric converting layer and said second electrode layer are formed from an identical photoelectric converting material having optical transmissivity and conductivity.

12. The photoelectric converting device according to claim 1, wherein said first electrode layer is said transparent conductive layer, and said dielectric base material has optical transmissivity.

13. The photoelectric converting device according to claim 12, wherein said second electrode layer is made of a metal conductive layer.

14. The photoelectric converting device according to claim 1, wherein said photoelectric converting material is made of ceramic.

15. The photoelectric converting device according to claim 1, wherein said photoelectric converting material is made of a semiconductor.

16. The photoelectric converting device according to claim 1, wherein said photoelectric converting material is at least one material selected from the group consisting of titanium oxide ($TiO_2$), strontium titanate ($TiSrO_3$), barium titanate ($TiBaO_3$), tin oxide ($SnO_2$), tungstic anhydride ($WO_3$), zinc oxide (ZnO), zinc oxide—magnesium oxide composite metal oxide (ZnO—MgO), tin oxide—magnesium oxide composite metal oxide ($SnO_2$—MgO), and complexes thereof.

17. The photoelectric converting device according to claim 1, wherein said metal material constituting each of said metal bodies is at least one material selected from the group consisting of gold, silver, copper, aluminum, and complexes thereof.

18. The photoelectric converting device according to claim 1, further comprising a covering layer that covers the surface of said protruding unit of each of said metal bodies and is made of a metal material that differs from said metal material constituting each of said metal bodies.

19. The photoelectric converting device according to claim 18, wherein said metal material constituting each of said metal bodies and said metal material constituting said covering layer are respectively selected from the group consisting of gold, silver, copper, aluminum, and complexes thereof.

20. The photoelectric converting device according to claim 19, wherein:
   said metal material constituting each of said metal bodies is gold; and
   said metal material constituting said covering layer is silver.

* * * * *